US010291359B2

(12) United States Patent
Xu et al.

(10) Patent No.: US 10,291,359 B2
(45) Date of Patent: May 14, 2019

(54) OF HYBRID AUTOMATIC REPEAT REQUEST (HARQ) FEEDBACK BITS FOR POLAR CODES

(71) Applicant: QUALCOMM Incorporated, San Diego, CA (US)

(72) Inventors: Changlong Xu, Beijing (CN); Jian Li, Beijing (CN); Chao Wei, Beijing (CN); Jilei Hou, Beijing (CN)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 15/643,003

(22) Filed: Jul. 6, 2017

(65) Prior Publication Data
US 2018/0034593 A1  Feb. 1, 2018

Related U.S. Application Data

(63) Continuation of application No. PCT/CN2016/091914, filed on Jul. 27, 2016.

(51) Int. Cl.
H04L 1/18 (2006.01)
H04L 1/00 (2006.01)
(Continued)

(52) U.S. Cl.
CPC .............. *H04L 1/08* (2013.01); *H04L 1/0011* (2013.01); *H04L 1/0058* (2013.01);
(Continued)

(58) Field of Classification Search
CPC ... H04L 1/0011; H04L 1/0058; H04L 1/0061; H04L 1/08; H04L 1/1671; H04L 1/1896; H04L 1/203; H04L 1/0079; H04L 1/1812
See application file for complete search history.

(56) References Cited

U.S. PATENT DOCUMENTS 5,583,500 A  12/1996  Allen et al.
5,844,918 A  12/1998  Kato
(Continued)

FOREIGN PATENT DOCUMENTS

CN  101682381 A   3/2010
CN  102783206 A  11/2012
(Continued)

OTHER PUBLICATIONS

International Search Report and Written Opinion—PCT/CN2016/091914—ISA/EPO—dated Apr. 17, 2017.
(Continued)

*Primary Examiner* — Guy J Lamarre
(74) *Attorney, Agent, or Firm* — Qualcomm IP Dept.; James Hunt Yancey, Jr.

(57) ABSTRACT

Certain aspects of the present disclosure relate to techniques and apparatus for design of hybrid automatic repeat request (HARQ) feedback bits. The method generally includes obtaining a payload to be transmitted, partitioning the payload into a plurality of blocks, and partitioning each block of the plurality of blocks into a plurality of sections. The method also includes deriving redundancy check information for each section of the plurality of sections, and generating a plurality of codewords, each comprising a block of the plurality of blocks and the redundancy check information for each section of the block, wherein a location of each of the sections in the codewords is determined based on an error rate corresponding to each of the sections.

30 Claims, 9 Drawing Sheets

(51) Int. Cl.
| | |
|---|---|
| *H04L 1/08* | (2006.01) |
| *H04L 1/16* | (2006.01) |
| *H04L 1/20* | (2006.01) |
| *G08C 25/02* | (2006.01) |

(52) U.S. Cl.
CPC .......... *H04L 1/0061* (2013.01); *H04L 1/0079* (2013.01); *H04L 1/1671* (2013.01); *H04L 1/1812* (2013.01); *H04L 1/1896* (2013.01); *H04L 1/203* (2013.01)

(56) References Cited

U.S. PATENT DOCUMENTS

| | | | |
|---|---|---|---|
| 6,633,865 | B1 | 10/2003 | Liao |
| 6,854,082 | B1 | 2/2005 | Rhee |
| 6,931,581 | B1 | 8/2005 | Cassiday et al. |
| 6,961,888 | B2 | 11/2005 | Jin et al. |
| 7,133,853 | B2 | 11/2006 | Richardson et al. |
| 7,526,717 | B2 | 4/2009 | Kyung et al. |
| 7,552,097 | B2 | 6/2009 | Richardson et al. |
| 7,571,372 | B1 | 8/2009 | Burd et al. |
| 7,627,801 | B2 | 12/2009 | Jin et al. |
| 7,793,194 | B2 | 9/2010 | Seo et al. |
| 7,840,880 | B1 | 11/2010 | Bain |
| 7,979,784 | B2 | 7/2011 | Shao et al. |
| 7,986,622 | B2 | 7/2011 | Frazier et al. |
| 8,006,162 | B2 | 8/2011 | Choi et al. |
| 8,132,072 | B2 | 3/2012 | El-Khamy et al. |
| 8,687,751 | B1* | 4/2014 | Lee .................... H04J 11/004 370/205 |
| 8,751,902 | B2 | 6/2014 | Jin et al. |
| 9,362,956 | B2 | 6/2016 | Mahdavifar et al. |
| 9,479,375 | B1 | 10/2016 | Ankarali et al. |
| 9,667,381 | B2 | 5/2017 | Jeong et al. |
| 9,692,451 | B2 | 6/2017 | Vasista et al. |
| 9,917,675 | B2 | 3/2018 | Kudekar et al. |
| 2002/0147954 | A1 | 10/2002 | Shea |
| 2003/0033575 | A1 | 2/2003 | Richardson et al. |
| 2003/0123409 | A1 | 7/2003 | Kwak et al. |
| 2004/0187129 | A1 | 9/2004 | Richardson |
| 2005/0078765 | A1 | 4/2005 | Jeong et al. |
| 2005/0149842 | A1 | 7/2005 | Kyung et al. |
| 2005/0283707 | A1 | 12/2005 | Sharon et al. |
| 2006/0020868 | A1 | 1/2006 | Richardson et al. |
| 2006/0020872 | A1 | 1/2006 | Richardson et al. |
| 2006/0184855 | A1 | 8/2006 | Wang et al. |
| 2007/0113148 | A1 | 5/2007 | Hong et al. |
| 2008/0178065 | A1 | 7/2008 | Khandekar et al. |
| 2008/0207120 | A1 | 8/2008 | Kurina et al. |
| 2009/0158129 | A1 | 6/2009 | Myung et al. |
| 2009/0204868 | A1 | 8/2009 | Park et al. |
| 2009/0217129 | A1 | 8/2009 | Myung et al. |
| 2009/0300461 | A1 | 12/2009 | Shor et al. |
| 2010/0023834 | A1 | 1/2010 | Richardson et al. |
| 2010/0077275 | A1 | 3/2010 | Yu et al. |
| 2010/0107033 | A1 | 4/2010 | Kuri et al. |
| 2010/0185926 | A1 | 7/2010 | Lawson et al. |
| 2010/0211844 | A1* | 8/2010 | Yuda .................... H04L 1/0025 714/749 |
| 2010/0257425 | A1 | 10/2010 | Yue et al. |
| 2011/0047433 | A1 | 2/2011 | Abu-Surra et al. |
| 2011/0066916 | A1 | 3/2011 | Abu-Surra et al. |
| 2012/0084625 | A1 | 4/2012 | Pisek et al. |
| 2012/0166917 | A1 | 6/2012 | El-Khamy et al. |
| 2012/0240001 | A1 | 9/2012 | Abu-Surra et al. |
| 2012/0317461 | A1 | 12/2012 | Hwang et al. |
| 2013/0117344 | A1 | 5/2013 | Gross et al. |
| 2014/0019820 | A1 | 1/2014 | Vardy et al. |
| 2014/0040214 | A1 | 2/2014 | Ma et al. |
| 2014/0201592 | A1 | 7/2014 | Shen et al. |
| 2014/0229788 | A1 | 8/2014 | Richardson |
| 2014/0229789 | A1 | 8/2014 | Richardson |
| 2014/0304574 | A1 | 10/2014 | Seo et al. |
| 2014/0365842 | A1 | 12/2014 | Li et al. |
| 2014/0365845 | A1 | 12/2014 | Pantelias et al. |
| 2015/0188666 | A1 | 7/2015 | Mahdavifar et al. |
| 2015/0229337 | A1* | 8/2015 | Alhussien ............. H03M 13/35 714/773 |
| 2015/0381208 | A1 | 12/2015 | Li et al. |
| 2016/0013810 | A1* | 1/2016 | Gross .................... H03M 13/09 714/776 |
| 2016/0013931 | A1 | 1/2016 | Pisek et al. |
| 2016/0087648 | A1 | 3/2016 | Korb et al. |
| 2016/0164537 | A1 | 6/2016 | Pisek et al. |
| 2016/0164629 | A1* | 6/2016 | Ahn ..................... H04L 1/0041 714/776 |
| 2016/0173132 | A1 | 6/2016 | Cho |
| 2016/0380763 | A1 | 12/2016 | Ahn et al. |
| 2017/0047947 | A1 | 2/2017 | Hong et al. |
| 2017/0141798 | A1 | 5/2017 | Kudekar et al. |
| 2017/0222663 | A1 | 8/2017 | Parthasarathy et al. |
| 2017/0331494 | A1 | 11/2017 | Richardson et al. |
| 2017/0331497 | A1 | 11/2017 | Richardson et al. |
| 2017/0353267 | A1 | 12/2017 | Kudekar et al. |
| 2017/0353269 | A1* | 12/2017 | Lin ....................... H04L 1/0041 |
| 2017/0359086 | A1 | 12/2017 | Kudekar et al. |
| 2017/0359148 | A1 | 12/2017 | Richardson et al. |
| 2018/0205498 | A1 | 7/2018 | Kudekar et al. |
| 2018/0226992 | A1 | 8/2018 | Panteleev et al. |
| 2018/0358984 | A1 | 12/2018 | Richardson et al. |
| 2018/0367245 | A1 | 12/2018 | Soriaga et al. |

FOREIGN PATENT DOCUMENTS

| | | |
|---|---|---|
| CN | 103746708 A | 4/2014 |
| CN | 105227189 A | 1/2016 |
| EP | 1601109 A2 | 11/2005 |
| EP | 2091171 A2 | 8/2009 |
| EP | 2096760 A1 | 9/2009 |
| EP | 2899912 A1 | 7/2015 |
| EP | 3264611 A1 | 1/2018 |
| WO | 2017209837 A1 | 12/2017 |
| WO | 2018128560 A1 | 7/2018 |

OTHER PUBLICATIONS

Arikan E., "A Survey of Reed-Muller Codes From Polar Coding Perspective", Information Theory Workshop (ITW), Piscataway, NJ, USA, Jan. 6, 2010, pp. 1-5, XP031703947, ISBN: 978-1-4244-6372-5.

Chen B., et al., "List Viterbi Algorithms for Continuous Transmission", IEEE Transactions on Communications, vol. 49 No. 5, XP011009921, May 1, 2001, pp. 784-792.

Chiu M.C., et al., "Reduced-Complexity SCL Decoding of Multi-CRC-Aided Polar Codes", Sep. 28, 2016, XP055384603, pp. 1-9, Retrieved from the Internet: URL:https://arxiv.org/pdf/1609.08813.pdf [retrieved on Jun. 23, 2017].

Deng X., et al., "Segmented Cyclic Redundancy Check: A Data Protection Scheme for Fast Reading RFID Tag's Memory," IEEE Wireless Communications and Networking Conference, 2008, pp. 1576-1581.

El-Khamy M., et al., "Binary Polar Codes are Optimized Codes for Bitwise Multistage Decoding", Arxiv.org, Cornell University Library, 201 Olin Library Cornell University Ithaca, NY 14853, Apr. 13, 2016, XP080695103, DOI: 10.1049/EL.2016.0837, 2 pages.

Ericsson: "Performance and Complexity of Per-Segment Crc Attachment Methods" 3GPP Draft; R1-073741, 3rd Generation Partnership Project (3GPP), Mobile Competence Centre, 650, Route Des Lucioles, F-06921, Sophia-Antipolis Cedex, France, vol. RAN WG1, No. Athens, Greece; Aug. 15, 2007, XP050107330, 3 pages.

Guo J., et al., "Multi-CRC Polar Codes and Their Applications", IEEE Communications Letters, Feb. 2016, vol. 20, No. 2, pp. 212-215.

Hashemi S.A., et al., "Partitioned Successive-Cancellation List Decoding of Polar Codes", 2016 IEEE International Conference on Acoustics. Speech and Signal Processing (ICASSP), Mar. 20, 2016, pp. 957-960, XP032900743, DOI: 10.1109/ICASSP.2016.7471817, [retrieved on May 18, 2015].

(56) References Cited

OTHER PUBLICATIONS

Jun Lin et al., "A reduced latency list decoding algorithm for polar codes", 2014 IEEE Workshop on Signal Processing Systems (SIPS), Oct. 1, 2014, p. 1-6.
Lucas R et al., "Improved Soft-Decision Decoding of Reed-Muller Codes as Generalized Multiple Concatenated Codes", ITG-Fachberi, vol. 183, VDE-Verlag, DE, No. 146, Mar. 5, 1998, pp. 137-142.
Mackay D.J.C., "Good Error-Correcting Codes Based on Very Sparse Matrices," IEEE Transactions on Information Theory, Mar. 1999, vol. 45 (2), pp. 399-431.
Mahdavifar H., et al., "On the Construction and Decoding of Concatenated Polar Codes", IEEE International Symposium on Information Theory, Jul. 7, 2013, pp. 952-956, XP032497043, ISSN: 2157-8095, DOI: 10.1109/ISIT.2013.6620367 [retrieved on Mar. 10, 2013].
Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.
Shea J.M., et al., "Multidimensional Codes" In: "Wiley Encyclopedia of Telecommunications," Jan. 1, 2003, vol. 3, pp. 1538-1551, XP055402230.
Stolte N., Rekursive Codes mit der Plotkin-Konstruktion and ihre Decodierung, D17 Darmstadter Dissertation, Jan. 1, 2002, 151 pages, (in particular, pp. 13-30), XP055241445, URL:http:I/tuprints.ulb.tu-darmstadt.de/epda/000183/stolte.pdf, Techn. Universitat, Diss., 2002 (Nicht f. d. Austausch)_Darmstadt [retrieved on Jan. 14, 2016].
Trifonov P., "Efficient Design and Decoding of Polar Codes", IEEE Transactions on Communications, vol. 60, No. 11, Nov. 1, 2012, XP011473857, ISSN: 0090-6778, DOI: 10.1109/TCOMM.2012.081512.110872, pp. 3221-3227.
Trifonov P., et al., "Generalized Concatenated Codes based on Polar Codes", 8th International Symposium on Wireless Communication Systems, Nov. 6, 2011, XP032090122, pp. 442-446, DOI: 10.1109/ISWCS.2011.6125399, ISBN: 978-1-61284-403-9.
Trifonov P., et al., "Fast Encoding of Polar Codes with Reed-Solomon Kernel," IEEE Transactions on Communications, May 2016, pp. 1-8.
Wang T., et al., "Parity-Check-Concatenated Polar Codes", IEEE Communications Letters, IEEE Service Center, Piscataway, NJ, US, vol. 20, No. 12, Dec. 1, 2016, pp. 2342-2345, XP011636292, ISSN: 1089-7798, DOI: 10.1109/LCOMM.2016.2607169 [retrieved on Dec. 8, 2016].
Wang Y., et al., "Concatenations of Polar Codes With Outer BCH Codes and Convolutional Codes", 2014 52nd Annual Allerton Conference on Communication, Control, and Computing (Allerton), Sep. 30, 2014, pp. 813-819, XP032731136, DOI: 10.1109/ALLERTON.2014.7028538 [retrieved on Jan. 30, 2015].
Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.
Zhou H., et al., "Segmented CRC-Aided SC List Polar Decoding", 2016 IEEE 83rd Vehicular Technology Conference, May 15, 2016, XP032918751, pp. 1-5, DOI: 10.1109/VTCSPRING.2016.7504469, [retrieved on Jul. 5, 2016].
Abbasfar A., et al., "Accumulate Repeat Accumulate Codes", Dec. 2, 2003, XP002585965, Retrieved from the Internet: URL: http://trs-new.jpl.nasa.gov/dspace/bitstream/2014/8047/1/03-3469.pdf [retrieved on Jun. 4, 2010], 6 pages.
Alcatel-Lucent et al., "LDPC Coding Proposal for LBC", 3GPP2 Draft; C30-20070226-002_C30-20070212-034R1_AHLQRZ_LDPC_PROPOSAL_FOR_LBC, Mar. 27, 2007, XP062206073, Retrieved from the Internet: URL:http://ftp.3gpp2.org/TSGC/Working/2007/2007-03-Atlanta/TSG-C-2007-03-Atlanta/WG3/LDPC Ad Hoc Call,2007.02.26/ pp. 1-27.
Alcatel-Lucent et al., "LDPC Coding Proposal for LBC", 3GPP2-Drafts, 2500 Wilson Boulevard, Suite 300, Arlington, Virginia 22201, USA, Mar. 15, 2007, XP040477608, 32 pages.
Arikan E., "Challenges and some new directions in channel coding," Computer Science, Information Theory, arXiv:1504.03916, Apr. 15, 2015, 11 pages.
Arikan E., "Channel Polarization: a Method for Constructing Capacity-Achieving Codes for Symmetric Binary-Input Memoryless Channels," IEEE Transactions on Information Theory, vol. 55 (7), 2009, pp. 3051-3073, XP080428257.
Chen T.Y., et al., "Protograph-based Raptor-Like LDPC Codes with Low Thresholds", IEEE International Conference on Communications, Jun. 10, 2012, DOI: 10.1109/ICC.2012.6363996, ISBN: 978-1-4577-2052-9, pp. 2161-2165.
El-Khamy M., et al., "Design of Rate Compatible Structured LDPC Codes for Hybrid ARQ Applications", IEEE, Aug. 1, 2009, vol. 27(6), pp. 965-973.
Ericsson: "Design Parameters and Implementation Aspects of LPDC Codes," 3GPP Draft; R1-1703537 Design Parameters and Implementation Aspects of LDPC Codes, 3rd Generation Partnership Project (3GPP), Mobile Competence Centre; 650, Route Des Lucioles; F-06921 Sophia-Antipolis, vol. RAN WG1, No. Athens, Greece; 20170213-20170217, Feb. 15, 2017, XP051222070, 10 pages, Retrieved from the Internet: URL: http://www.3gpp.org/ftp/tsg_ran/WG1_RL1/TSGR1_88/Docs/ [retrieved on Feb. 15, 2017].
Ericsson: "System Information for Low Complexity and Extended Coverage", 3GPP Draft; R1-1708730—SYSINFO for Low Complexity and Ext Coverage, 3rd Generation Partnership Project (3GPP), Mobile competence Centre; 650, Route Des Lucioles; F-06921 Sophia-Antipolis Cedex; France, vol. RAN WG1, No. Hangzhou, China; 20170515-20170519 May 7, 2017, XP051263297, Retrieved from the Internet: URL:http://www.3gpp.org/ftp/tsg_ran/WG1_RL1/TSGR1_89/Docs/ [retrieved on May 7, 2017], 3 pages.
IEEE: "IEEEStd 802.16e-2005, Air Interface for Fixed and Mobile Broadband Wireless Access Systems," Amendment 2 and Corrigendum 1 to IEEE Std 802.16-2004, IEEE STD 802.16E-2005, Feb. 28, 2006 (Feb. 28, 2006), pp. 326-630, XP002515198.
"IEEE Standard for Local and Metropolitan Area Networks Part 16: Air Interface for Broadband Wireless Access Systems; IEEE Std 802.16/2009 (Revision of IEEE Std 802.16/2004)", May 29, 2009, XP068045637, ISBN: 978-0-7381-5919-5, pp. 1-2080.
Jiang M., et al., "An Improved Variable Length Coding Scheme Using Structured LDPC Codes", IEEE, Oct 1, 2010, 5 Pages.
Leroux C., et al., "A Semi-Parallel Successive-Cancellation Decoder for Polar Codes," IEEE Transactions on Signal Processing, Jan. 2013, vol. 61, No. 2, pp. 1-11.
Liu J., et al., "Rate-Compatible LDPC Codes with Short Block Lengths Based on Puncturing and Extension Techniques," 2014, pp. 1-20.
Mahdavifar H., et al., "Fast Multi-dimensional Polar Encoding and Decoding," Information Theory and Applications Workshop (ITA), IEEE, 2014, 5 pages.
Mediatek Inc: "Multi-Codebook Embedded Compact QC-LDPC Designs", 3GPP TSG-RAN WG1 NR, R1-1706175, Apr. 4, 2017, XP051252463, Retrieved from the Internet: URL:http://www.3gpp.org/ftp/tsg_ranNVG1_RL1/TSGR1_88b/Docs/, 14 pages.
Myung S., et al., "Extension of Quasi-cyclic LDPC Codes by Lifting," Proc., IEEE International Symposium on Information Theory, ISIT 2005, Adelaide, Australia, Sep. 4, 2005 (Sep. 4, 2005)-Sep. 9, 2005 (Sep. 9, 2005), pp. 2305-2309, XP010845965, ISBN: 978-0-7803-9151-2.
Myung S., et al., "Lifting Methods for Quasi-Cyclic LDPC Codes", IEEE Communications Letters, Jun. 2006, vol. 10, No. 6, pp. 489-491.
Nguyen T.V., et al., "The Design of Rate-Compatible Protograph LDPC Codes", IEEE Transactions on Communications, Oct. 1, 2012, vol. 60, No. 10, XP011469171, ISSN: 0090-6778, DOI: 10.1109/TCOMM.2012.081012.110010, pp. 2841-2850.
Niu K., et al., "CRC-Aided Decoding of Polar Codes," IEEE Communications Letters, Oct. 2012, vol. 16, No. 10, pp. 1668-1671.
Nokia et al., "LDPC Design for eMBB", 3GPP Draft; R1-1705857_LDPC Design for EMBB, 3rd Generation Partnership Project (3GPP), Mobile Competence Centre; 650, Route Des Lucioles; F-06921 Sophia-Antipolis Cedex; France, vol. RAN WG1, No. Spokane, Wa, USA; 20170403-20170407 Mar. 24, 2017, XP051250965, Retrieved from the Internet: URL:http://www.3gpp.org/ftp/tsg_ran/WG1_RL1/TSGR1_88b/Docs/ [retrieved on Mar. 24, 2017], 8 pages.

(56) References Cited

OTHER PUBLICATIONS

Qualcomm Incorporated: "LDPC Codes—HARQ, Rate", 3GPP Draft; R1-162209, LDPC_Ratecompatibility_Highleveldesign, 3rd Generation Partnership Project (3GPP), Mobile Competence Centre, 650, Route Des Lucioles ; F-06921 Sophia-Antipolis Cedex; France, vol. RAN WG1, No. Busan, Korea; Apr. 2, 2016, XP051080037, Retrieved from the Internet: URL:http://www.3gpp.org/ftp/tsg_ran/WG1_RL1/TSGR1_84b/Docs/, 4 pages.

Qualcomm Incorporated: "LDPC Rate Compatible Design Overview", 3GPP Draft; R1-1610137, 3rd Generation Partnership Project (3GPP), Mobile Competence Centre, 650, Route Des Lucioles; F-06921; Sophia-Anti Polis Cedex, vol. RAN WG1. No. Lisbon, Portugal, Oct. 9, 2016, 27 pages, XP051150160, Retrieved from the Internet: URL: http://www.3gpp.org/ftp/Meetings_3GPP_SYNC/RAN1/Docs/ [retrieved on Oct. 9, 2016].

Qualcomm Incorporated: "LDPC Rate Matching", 3GPP Draft; R1-1708640 LDPC Rate Matching, 3rd Generation Partnership Project (3GPP), Mobile Competence Centre; 650, Route Des Lucioles; F-06921 Sophia-Antipolis Cedex; France, vol. RAN WG1, No. Hangzhou, China; 20170515-20170519 May 14, 2017, XP051273827, Retrieved from the Internet: URL:http://www.3gpp.org/ftp/Meetings_3GPP_SYNC/RAN1/Docs/ [retrieved on May 14, 2017], 3 pages.

Richardson T., et al., "Design of Low-Density Parity Check Codes for 5G New Radio," IEEE Communications magazine, vol. 56 (3), Mar. 1, 2018, pp. 28-34, XP055480192.

Surra S.A., et al., "Gigabit Rate Achieving Low-Power LDPC Codes: Design and Architecture", IEEE, Mar. 1, 2011, pp. 1994-1999.

Tal I., et al., "List Decoding of Polar Codes", IEEE Transactions on Information Theory, May 31, 2012, pp. 1-11.

Tal I., et al. "List Decoding of Polar Codes", IEEE Transactions on Information Theory, Institute of Electrical and Electronics Engineers, May 2015, vol. 61, No. 5, pp. 2213-2226.

Xie Y., et al., "Design of Rate Compatible Protograph-based LDPC Codes with Mixed Circulants", IEEE, 6th International Symposium on Turbo Codes & Iterative Information Processing, Sep. 2010, pp. 434-438.

Zte: "Structured LDPC Coding with Rate Matching", 3GPP Draft; R1-060115, Mobile Competence Centre; 650, Route Des Lucioles; F-06921 Sophia-Antipolis Cedex; France, vol. RAN WG1, No. Helsinki, Finland; Jan. 19, 2006, XP050950962, Retrieved from the Internet: URL:http://www.3gpp.org/ftp/tsg_ran/WG1_RL1/TSGR1_AH/LTE_AH_0601/Docs/, 13 pages.

* cited by examiner

| Value | Feedback bit | Description |
|---|---|---|
| ACK | 1 | All the coded blocks are decoded correctly |
| NACK | 0 | otherwise |

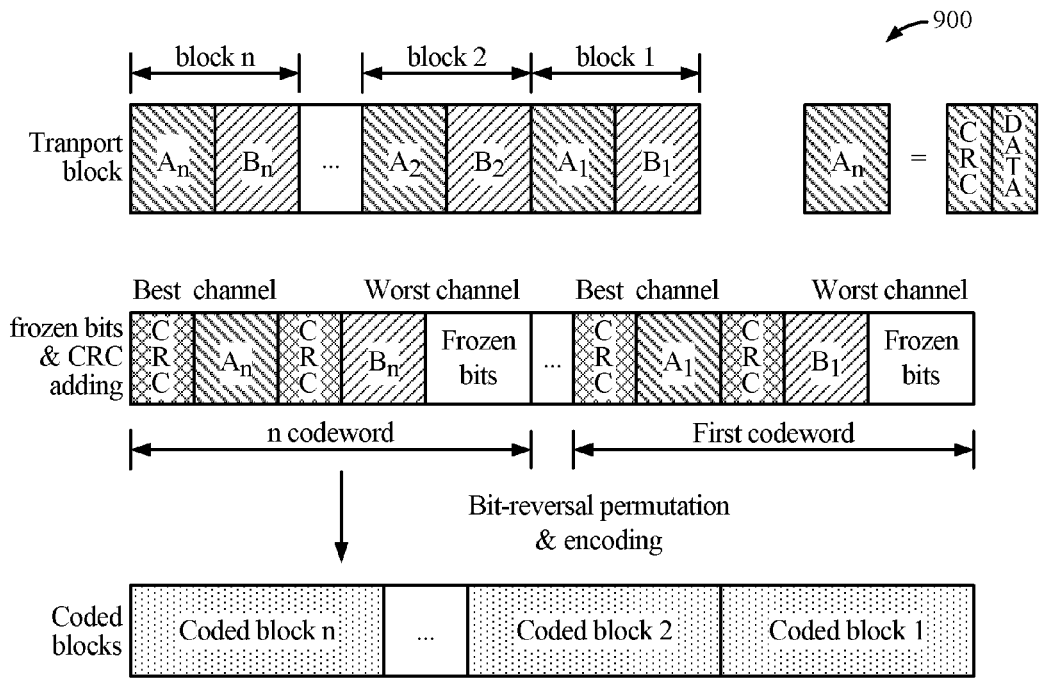

FIG. 9A

| Feedback bits | TB results | Group A results | Group B results | Description |
|---|---|---|---|---|
| 00 | X | X | X | The overall TB is not decoded correctly. Group A is not decoded correctly. Group B is not decoded correctly. |
| 01 | X | X | ✓ | The overall TB is not decoded correctly. Group A is not decoded correctly. Group B is decoded correctly. |
| 10 | X | ✓ | X | The overall TB is not decoded correctly. Group A is decoded correctly. Group B is not decoded correctly. |
| 11 | ✓ | ✓ | ✓ | The overall TB is decoded correctly. |

FIG. 9B

OF HYBRID AUTOMATIC REPEAT REQUEST (HARQ) FEEDBACK BITS FOR POLAR CODES

CROSS-REFERENCE TO RELATED APPLICATIONS

This application is a continuation of International Application PCT/CN2016/091914, filed Jul. 27, 2016 which is expressly incorporated herein by reference in its entirety.

TECHNICAL FIELD

Certain aspects of the present disclosure generally relate to wireless communications and, more particularly, to a method and apparatus for providing feedback.

BACKGROUND

In a transmitter of all modern wireless communication links, an output sequence of bits from an error correcting code can be mapped onto a sequence of complex modulation symbols. These symbols can be then used to create a waveform suitable for transmission across a wireless channel. Particularly as data rates increase, decoding performance on the receiver side can be a limiting factor to achievable data rates.

SUMMARY

Certain aspects of the present disclosure provide techniques and apparatus for design of hybrid automatic repeat request (HARQ) feedback bits.

Certain aspects provide a method for wireless communications. The method generally includes obtaining a payload to be transmitted, partitioning the payload into a plurality of blocks, partitioning each block of the plurality of blocks into a plurality of sections, deriving redundancy check information for each section of the plurality of sections, and generating a plurality of codewords, each comprising a block of the plurality of blocks and the redundancy check information for each section of the block, wherein a location of each of the sections in the codewords is determined based on an error rate corresponding to each of the sections.

Certain aspects provide a method for wireless communications. The method generally includes receiving a plurality of codewords, each comprising a plurality of blocks, wherein each of the plurality of blocks comprise a plurality of sections and redundancy check information for each section of the plurality of sections, wherein a location of each of the plurality of sections of each block is determined based on an error rate corresponding to each of the plurality of sections of each block, decoding the plurality of sections of each block, verifying whether the plurality of sections of each block were properly decoded based on the redundancy check information for each of the decoded sections, and transmitting an indication of whether the plurality of sections each block were properly decoded based on the verification.

Certain aspects provide an apparatus for wireless communications. The apparatus generally includes at least one processor configured to obtain a payload to be transmitted, partition the payload into a plurality of blocks, partition each block of the plurality of blocks into a plurality of sections, derive redundancy check information for each section of the plurality of sections, and generate a plurality of codewords, each comprising a block of the plurality of blocks and the redundancy check information for each section of the block, wherein a location of each of the sections in the codewords is determined based on an error rate corresponding to each of the sections, and a memory coupled to the at least one processor.

Certain aspects provide an apparatus for wireless communications an apparatus for wireless communication. The apparatus generally includes at least one antenna, a processing system configured to receive, via the at least one antenna, a plurality of codewords, each comprising a plurality of blocks, wherein each of the plurality of blocks comprise a plurality of sections and redundancy check information for each section of the plurality of sections, wherein a location of each of the plurality of sections of each block is determined based on an error rate corresponding to each of the plurality of sections of each block, decode the plurality of sections of each block, verify whether the plurality of sections of each block were properly decoded based on the redundancy check information for each of the decoded sections, and transmit, via the at least one antenna, an indication of whether the plurality of sections of each block was properly decoded based on the verification.

Certain aspects provide an apparatus for wireless communications. The apparatus generally includes means for obtaining a payload to be transmitted, means for partitioning the payload into a plurality of blocks, means for partitioning each block of the plurality of blocks into a plurality of sections, means for deriving redundancy check information for each section of the plurality of sections, and means for generating a plurality of codewords, each comprising a block of the plurality of blocks and the redundancy check information for each section of the block, wherein a location of each of the sections in the codewords is determined based on an error rate corresponding to each of the sections.

Certain aspects provide an apparatus for wireless communications. The apparatus generally includes means for receiving, via the at least one antenna, a plurality of codewords, each comprising a plurality of blocks, wherein each of the plurality of blocks comprise a plurality of sections and redundancy check information for each section of the plurality of sections, wherein a location of each of the plurality of sections of each block is determined based on an error rate corresponding to each of the plurality of sections of each block, means for decoding the plurality of sections of each block, means for verifying whether the plurality of sections of each block were properly decoded based on the redundancy check information for each of the decoded sections, and means for transmitting an indication of whether the plurality of sections of each block was properly decoded based on the verification.

Certain aspects provide a computer-readable medium having instructions stored thereon for obtaining a payload to be transmitted, partitioning the payload into a plurality of blocks, partitioning each block of the plurality of blocks into a plurality of sections, deriving redundancy check information for each section of the plurality of sections, and generating a plurality of codewords, each comprising a block of the plurality of blocks and the redundancy check information for each section of the block, wherein a location of each of the sections in the codewords is determined based on an error rate corresponding to each of the sections.

Certain aspects provide a computer-readable medium having instructions stored thereon for receiving a plurality of codewords, each comprising a plurality of blocks, wherein each of the plurality of blocks comprise a plurality of sections and redundancy check information for each section of the plurality of sections, wherein a location of each of the plurality of sections of each block is determined based on an error rate corresponding to each of the plurality of sections of each block, decoding the plurality of sections of each block, verifying whether the plurality of sections of each block were properly decoded based on the redundancy check information for each of the decoded sections, and transmitting an indication of whether the plurality of sections of each block was properly decoded based on the verification.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 9A illustrates an example structure of coded blocks segmented into two block groups, in accordance with certain aspects of the present disclosure.

FIG. 9B illustrates an example structure of HARQ feedback bits for coded blocks segmented into two block groups, in accordance with certain aspects of the present disclosure.

DETAILED DESCRIPTION

Figure 1:
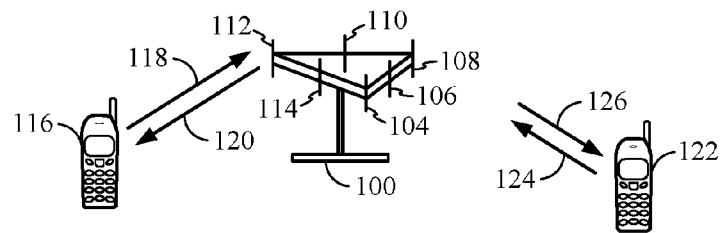
FIG. 1 illustrates an example wireless communication system in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Wireless Communication System

The techniques described herein may be used for various wireless communication networks such as Orthogonal Frequency Division Multiplexing (OFDM) networks, Time Division Multiple Access (TDMA) networks, Frequency Division Multiple Access (FDMA) networks, Orthogonal FDMA (OFDMA) networks, Single-Carrier FDMA (SC-FDMA) networks, Code Division Multiple Access (CDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16 (e.g., WiMAX (Worldwide Interoperability for Microwave Access)), IEEE 802.20, Flash-OFDM®, etc. UTRA, E-UTRA, and GSM are part of Universal Mobile Telecommunication System (UMTS). Long Term Evolution (LTE) and Long Term Evolution Advanced (LTE-A) are upcoming releases of UMTS that use E-UTRA. UTRA, E-UTRA, GSM, UMTS and LTE are described in documents from an organization named "3rd Generation Partnership Project" (3GPP). CDMA2000 is described in documents from an organization named "3rd Generation Partnership Project 2" (3GPP2). CDMA2000 is described in documents from an organization named "3rd Generation Partnership Project 2" (3GPP2). These various radio technologies and standards are known in the art. For clarity, certain aspects of the techniques are described below for LTE and LTE-A.

The teachings herein may be incorporated into (e.g., implemented within or performed by) a variety of wired or wireless apparatuses (e.g., nodes). In some aspects a node comprises a wireless node. Such wireless node may provide, for example, connectivity for or to a network (e.g., a wide area network such as the Internet or a cellular network) via a wired or wireless communication link. In some aspects, a wireless node implemented in accordance with the teachings herein may comprise an access point or an access terminal.

An access point ("AP") may comprise, be implemented as, or known as NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology. In some implementations an access point may comprise a set top box kiosk, a media center, or any other suitable device that is configured to communicate via a wireless or wired medium.

An access terminal ("AT") may comprise, be implemented as, or known as an access terminal, a subscriber station, a subscriber unit, a mobile station, a remote station, a remote terminal, a user terminal, a user agent, a user device, user equipment, a user station, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), a tablet, an entertainment device (e.g., a music or video device, or a satellite radio), a television display, a flip-cam, a security video camera, a digital video recorder (DVR), a global positioning system device, or any other suitable device that is configured to communicate via a wireless or wired medium.

Referring to FIG. 1, a multiple access wireless communication system according to one aspect is illustrated. In an aspect of the present disclosure, the wireless communication system from FIG. 1 may be a wireless mobile broadband system based on Orthogonal Frequency Division Multiplexing (OFDM). An access point 100 (AP) may include multiple antenna groups, one group including antennas 104 and 106, another group including antennas 108 and 110, and an additional group including antennas 112 and 114. In FIG. 1, only two antennas are shown for each antenna group, however, more or fewer antennas may be utilized for each antenna group. Access terminal 116 (AT) may be in communication with antennas 112 and 114, where antennas 112 and 114 transmit information to access terminal 116 over forward link 120 and receive information from access terminal 116 over reverse link 118. Access terminal 122 may be in communication with antennas 106 and 108, where antennas 106 and 108 transmit information to access terminal 122 over forward link 126 and receive information from access terminal 122 over reverse link 124. In a FDD system, communication links 118, 120, 124 and 126 may use different frequency for communication. For example, forward link 120 may use a different frequency then that used by reverse link 118.

Each group of antennas and/or the area in which they are designed to communicate is often referred to as a sector of the access point. In one aspect of the present disclosure each antenna group may be designed to communicate to access terminals in a sector of the areas covered by access point 100.

In communication over forward links 120 and 126, the transmitting antennas of access point 100 may utilize beamforming in order to improve the signal-to-noise ratio of forward links for the different access terminals 116 and 122. Also, an access point using beamforming to transmit to access terminals scattered randomly through its coverage causes less interference to access terminals in neighboring cells than an access point transmitting through a single antenna to all its access terminals.

Figure 2:
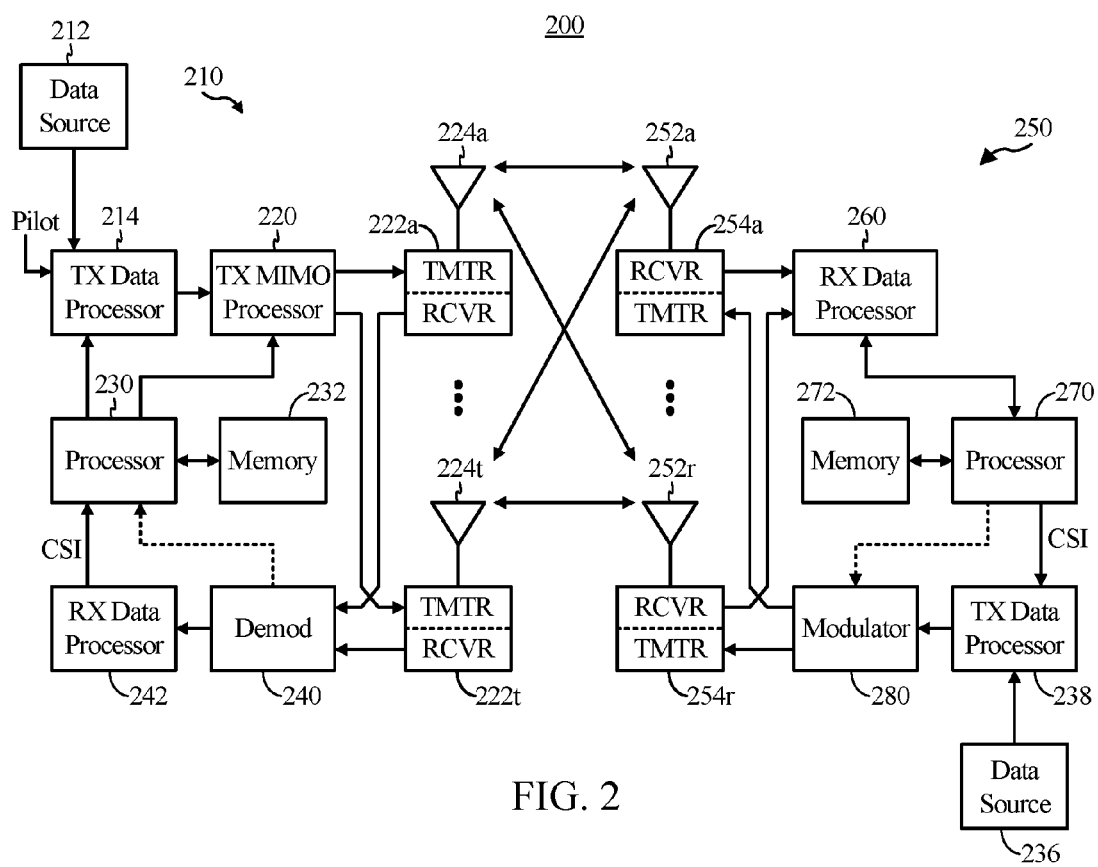
FIG. 2 illustrates a block diagram of an access point and a user terminal in accordance with certain aspects of the present disclosure.

FIG. 2 illustrates a block diagram of an aspect of a transmitter system 210 (e.g., also known as the access point) and a receiver system 250 (e.g., also known as the access terminal) in a wireless communications system, for example, a MIMO system 200. At the transmitter system 210, traffic data for a number of data streams is provided from a data source 212 to a transmit (TX) data processor 214.

In one aspect of the present disclosure, each data stream may be transmitted over a respective transmit antenna. TX data processor 214 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QPSK, m-QPSK, or m-QAM) selected for that data stream to provide modulation symbols. The data rate, coding, and modulation for each data stream may be determined by instructions performed by processor 230.

The modulation symbols for all data streams are then provided to a TX MIMO processor 220, which may further process the modulation symbols (e.g., for OFDM). TX MIMO processor 220 then provides $N_T$ modulation symbol streams to $N_T$ transmitters (TMTR) 222a through 222t. In certain aspects of the present disclosure, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At receiver system 250, the transmitted modulated signals may be received by $N_R$ antennas 252a through 252r and the received signal from each antenna 252 may be provided to a respective receiver (RCVR) 254a through 254r. Each receiver 254 may condition (e.g., filters, amplifies, and downconverts) a respective received signal, digitize the conditioned signal to provide samples, and further process the samples to provide a corresponding "received" symbol stream.

An RX data processor 260 then receives and processes the $N_R$ received symbol streams from $N_R$ receivers 254 based on a particular receiver processing technique to provide $N_T$ "detected" symbol streams. The RX data processor 260 then demodulates, deinterleaves, and decodes each detected symbol stream to recover the traffic data for the data stream. The processing by RX data processor 260 may be complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion. The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beamforming weights, and then processes the extracted message.

Figure 3:
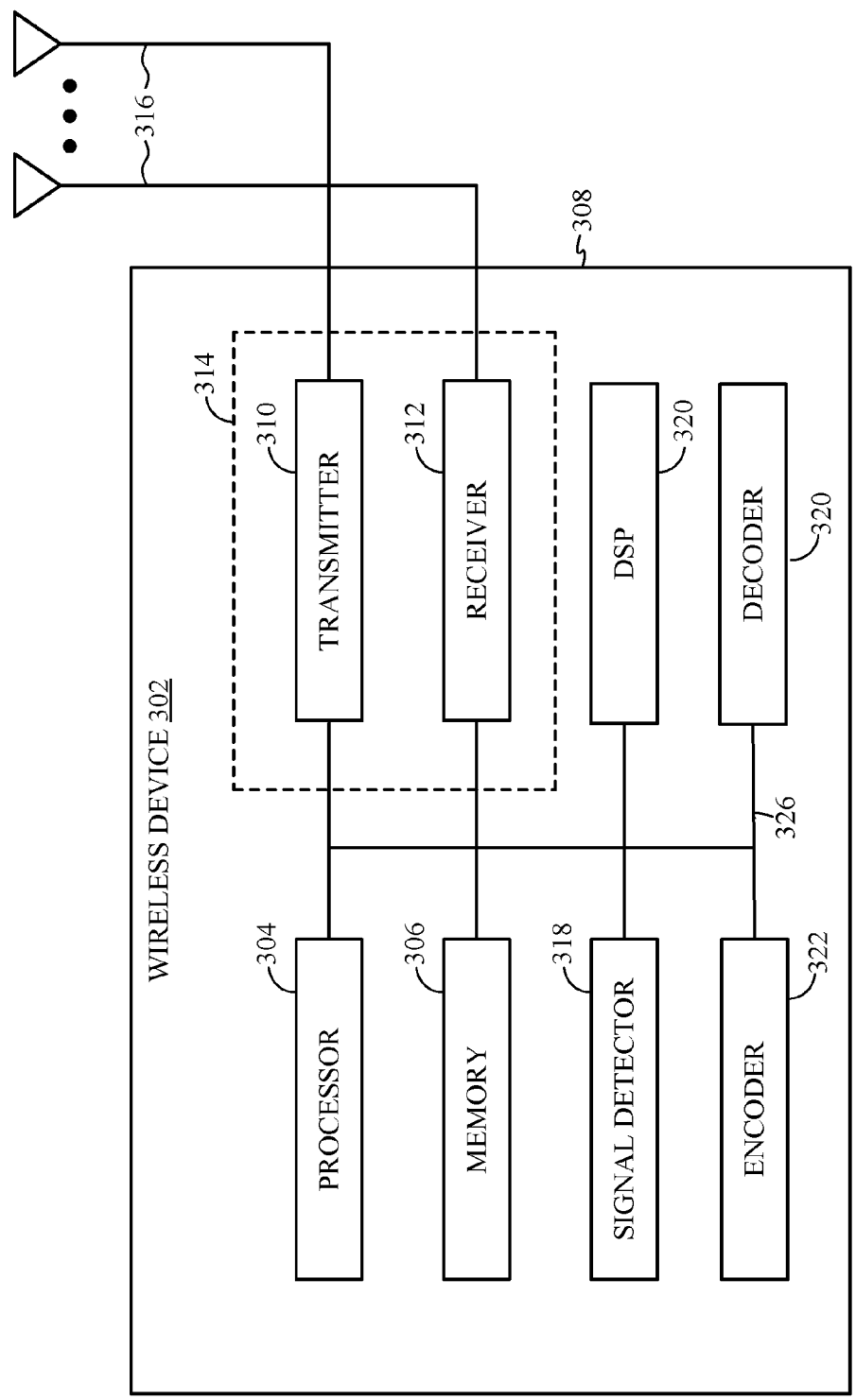
FIG. 3 illustrates a block diagram of an example wireless device in accordance with certain aspects of the present disclosure.

FIG. 3 illustrates various components that may be utilized in a wireless device 302 that may be employed within the wireless communication system from FIG. 1. The wireless device 302 is an example of a device that may be configured to implement the various methods described herein. The wireless device 302 may be an access point 100 from FIG. 1 or any of access terminals 116, 122.

The wireless device 302 may include a processor 304 which controls operation of the wireless device 302. The processor 304 may also be referred to as a central processing unit (CPU). Memory 306, which may include both read-only memory (ROM) and random access memory (RAM), provides instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable to implement the methods described herein.

The wireless device 302 may also include a housing 308 that may include a transmitter 310 and a receiver 312 to allow transmission and reception of data between the wireless device 302 and a remote location. The transmitter 310 and receiver 312 may be combined into a transceiver 314. A single or a plurality of transmit antennas 316 may be attached to the housing 308 and electrically coupled to the transceiver 314. The wireless device 302 may also include (not shown) multiple transmitters, multiple receivers, and multiple transceivers.

The wireless device 302 may also include a signal detector 318 that may be used in an effort to detect and quantify the level of signals received by the transceiver 314. The signal detector 318 may detect such signals as total energy, energy per subcarrier per symbol, power spectral density and other signals. The wireless device 302 may also include a digital signal processor (DSP) 320 for use in processing signals.

Additionally, the wireless device may also include an encoder 322 for use in encoding signals for transmission and a decoder 324 for use in decoding received signals.

The various components of the wireless device 302 may be coupled together by a bus system 326, which may include a power bus, a control signal bus, and a status signal bus in addition to a data bus.

Figure 4:
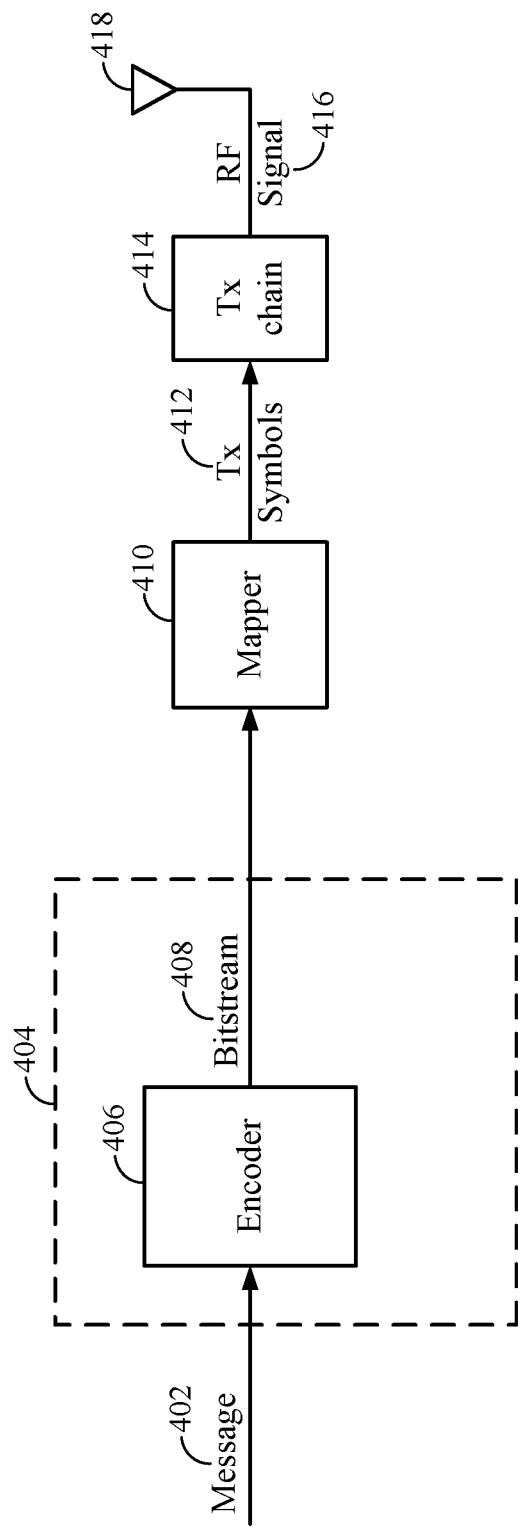
FIG. 4 is a simplified block diagram illustrating a decoder, in accordance with certain aspects of the present disclosure.

FIG. 4 is a simplified block diagram illustrating an encoder, in accordance with certain aspects of the present disclosure. According to certain aspects, the encoder 322 illustrated in FIG. 3 may comprise the encoder illustrated in FIG. 4. FIG. 4 illustrates a portion of a radio frequency (RF) modem 404 that may be configured to provide an encoded message for wireless transmission. In one example, an encoder 406 in a base station (e.g., BS 110 and/or 210) (or an access terminal on the reverse path) receives a message 402 for transmission. The message 402 may contain data and/or encoded voice or other content directed to the receiving device. The encoder 406 encodes the message using a suitable modulation and coding scheme (MCS), typically selected based on a configuration defined by the base station 110/210 or another network entity. In some cases, the encoder 406 may encode the message using techniques described below (e.g., by using a convolutional code). An encoded bitstream 408 produced by the encoder 406 may then be provided to a mapper 410 that generates a sequence of Tx symbols 412 that are modulated, amplified and otherwise processed by Tx chain 414 to produce an RF signal 416 for transmission through antenna 418.

Figure 5:
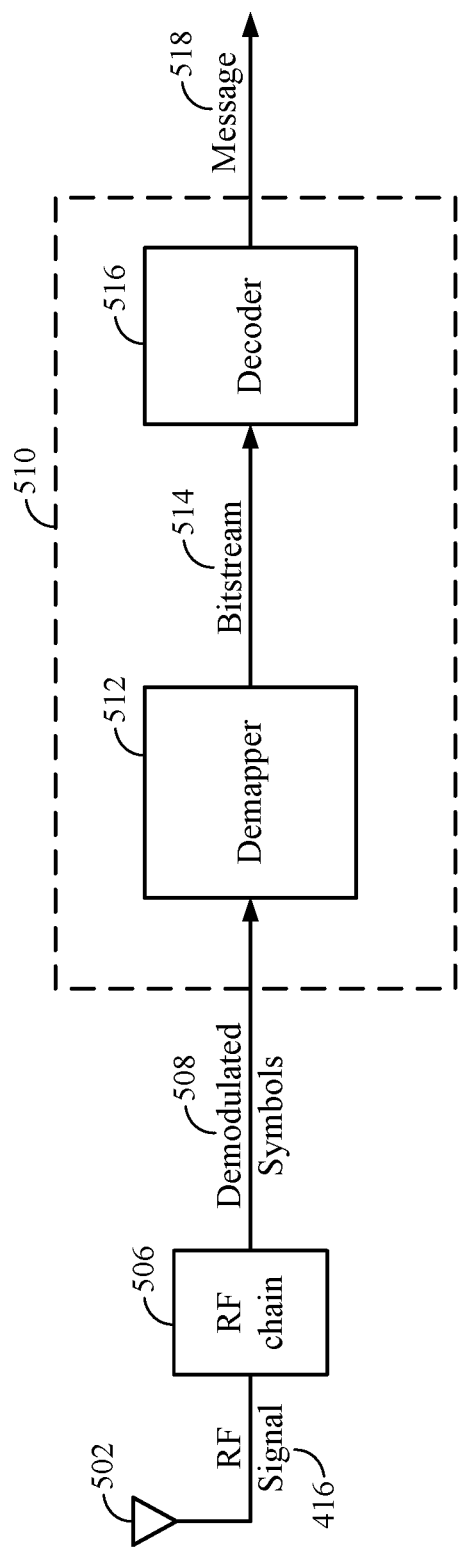
FIG. 5 is a simplified block diagram illustrating a decoder, in accordance with certain aspects of the present disclosure.

FIG. 5 is a simplified block diagram illustrating a decoder, in accordance with certain aspects of the present disclosure. According to certain aspects, the decoder 324 illustrated in FIG. 3 may comprise the decoder illustrated in FIG. 5. FIG. 5 illustrates a portion of a RF modem 510 that may be configured to receive and decode a wirelessly transmitted signal including an encoded message (e.g., a message encoded using a convolutional code as described below). In various examples, the modem 510 receiving the signal may reside at the access terminal, at the base station, or at any other suitable apparatus or means for carrying out the described functions. An antenna 502 provides an RF signal 416 (i.e., the RF signal produced in FIG. 4) to an access terminal (e.g., access terminal 116, 118, and/or 250). An RF chain 506 processes and demodulates the RF signal 418 and may provide a sequence of symbols 508 to a demapper 512, which produces a bitstream 514 representative of the encoded message.

A decoder 516 may then be used to decode m-bit information strings from a bitstream that has been encoded using a coding scheme (e.g., a convolutional code). The decoder 516 may comprise a Viterbi decoder, an algebraic decoder, a butterfly decoder, or another suitable decoder. In one example, a Viterbi decoder employs the well-known Viterbi algorithm to find the most likely sequence of signaling states (the Viterbi path) that corresponds to a received bitstream 514. The bitstream 514 may be decoded based on a statistical analysis of LLRs calculated for the bitstream 514. In one example, a Viterbi decoder may compare and select the correct Viterbi path that defines a sequence of signaling states using a likelihood ratio test to generate LLRs from the bitstream 514. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bitstream 514. The decoder 516 may then decode the bitstream 514 based on the LLRs to determine the message 518 containing data and/or encoded voice or other content transmitted from the base station (e.g., BS 110 and/or 210). The decoder may decode the bitsteam 514 in accordance with aspects of the present disclosure presented below.

Example Hybrid Automatic Repeat Request (Harq) Feedback Bits For Polar Codes

Aspects of the present disclosure are generally directed to an efficient design of hybrid automatic repeat request (HARQ) feedback bits for Polar codes by considering the sorting of channels based on the bit-error probability.

Polar codes were invented in 2007 and are the first codes with an explicit construction to provably achieve the channel capacity for symmetric binary-input discrete memoryless channels. The capacity can be achieved with a simple successive cancellation (SC) decoder. Polar codes and low-density parity check (LDPC) codes are two competitive candidates for 5G channel coding.

Polar codes are block codes. The generate matrices of polar codes are the submatrices of Hadamard matrices. To construct polar codes, the rows of the Hadamard matrices corresponding to the good channels (e.g., having low bit-error probability) may be selected for information bits. The bad channels (e.g., having high bit-error probability) may be used for frozen bits with fixed value of zeros. In a practical system, density evolution or Gaussian approximation is generally used to determine the bit-error probability of each channel. The bit-error probabilities of all the channels may be sorted. If N information bits are desired, the best N channels (with low bit-error probability) are selected for information bits while the remaining channels are designated for frozen bits. If the information blocks are divided into several equal sub-blocks, the block error rate of the sub-blocks close to the best channel should be lower than that close to the worst channel. HARQ scheme is widely used in wireless communication systems to improve transmission efficiency. HARQ scheme generally includes the retransmission of coded blocks that are not decoded correctly at a receiver. Aspects of the present disclosure use this property for an efficient design of HARQ feedback.

Figures 6A, 6B:
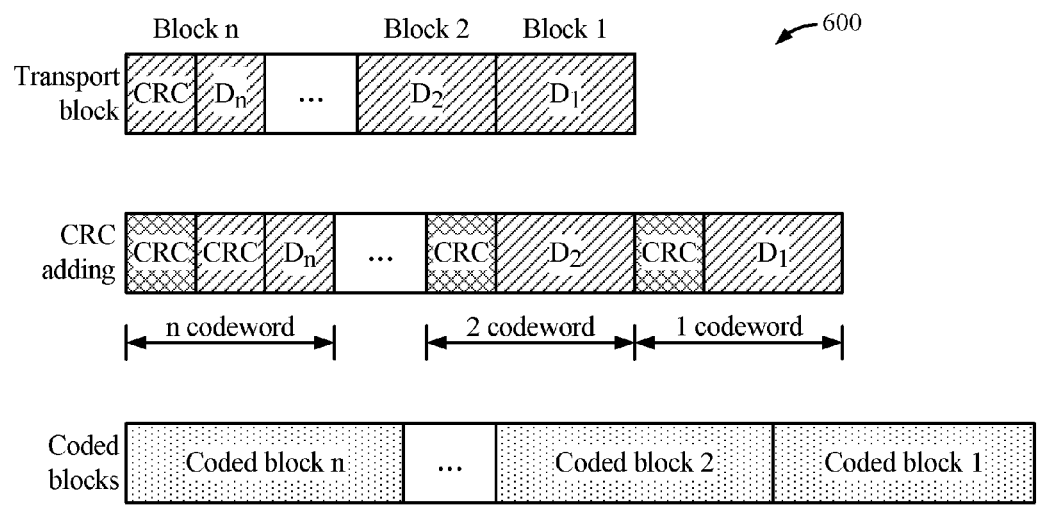
FIG. 6A illustrates an example structure of coded blocks of a signal transmission.
FIG. 6B illustrates an example structure of hybrid automatic repeat request (HARQ) feedback bits.

FIG. 6A illustrates an example structure 600 of coded blocks of a signal transmission. A large transport block (TB) may be segmented into several small sub-blocks (e.g., if the TB size is larger than 6144 bits), such as block 1 to block n. In some cases, there may be a single cyclic redundancy check (CRC) attached for all the bits in the transport block. The CRC may be used to determine if the TB is decoded correctly. The HARQ feedback bit is generated based on the decoding result. In certain aspects, each of the sub-blocks may be encoded as one codeword and each of the codewords may include a CRC for early termination.

FIG. 6B illustrates an example structure 602 of HARQ feedback bits. As illustrated in FIG. 6A, a TB may be segmented into several blocks and each block may be encoded as one codeword. As presented above, a CRC may be attached for each block and may be used for early termination. In this case, only a single bit may be used for acknowledgement/no-acknowledgement (ACK/NACK). That is, a NACK may be obtained by a transmitter for an entire block even if only one sub-block was not decoded correctly at the receiver. In this case, all the sub-blocks may be retransmitted again as the transmitter would not be able to know which sub-blocks were not decoded correctly, resulting in wasted resources. Moreover, it may be difficult for the receiver to feed back the CRC result for each block to the transmitter due to a large number of ACK/NACK bits associated with this option.

In 5G wireless communication systems, the desired data rate is high. To provide high data rate, a large size TB (e.g., with up to one million bits) may be implemented. If all the coded blocks are retransmitted when majority of them are decoded correctly, a significant amount of resources may be wasted.

Aspects of the present disclosures provide a more efficient HARQ feedback process. For example, polar codes may be used to divide coded blocks into several groups and a bit may be used to indicate the overall decoding results of each group. This way, multiple feedback bits may be used to signal the decoding results of the groups. If the blocks in a group are decoded correctly, that group may not be retransmitted, saving resources.

Figure 7:
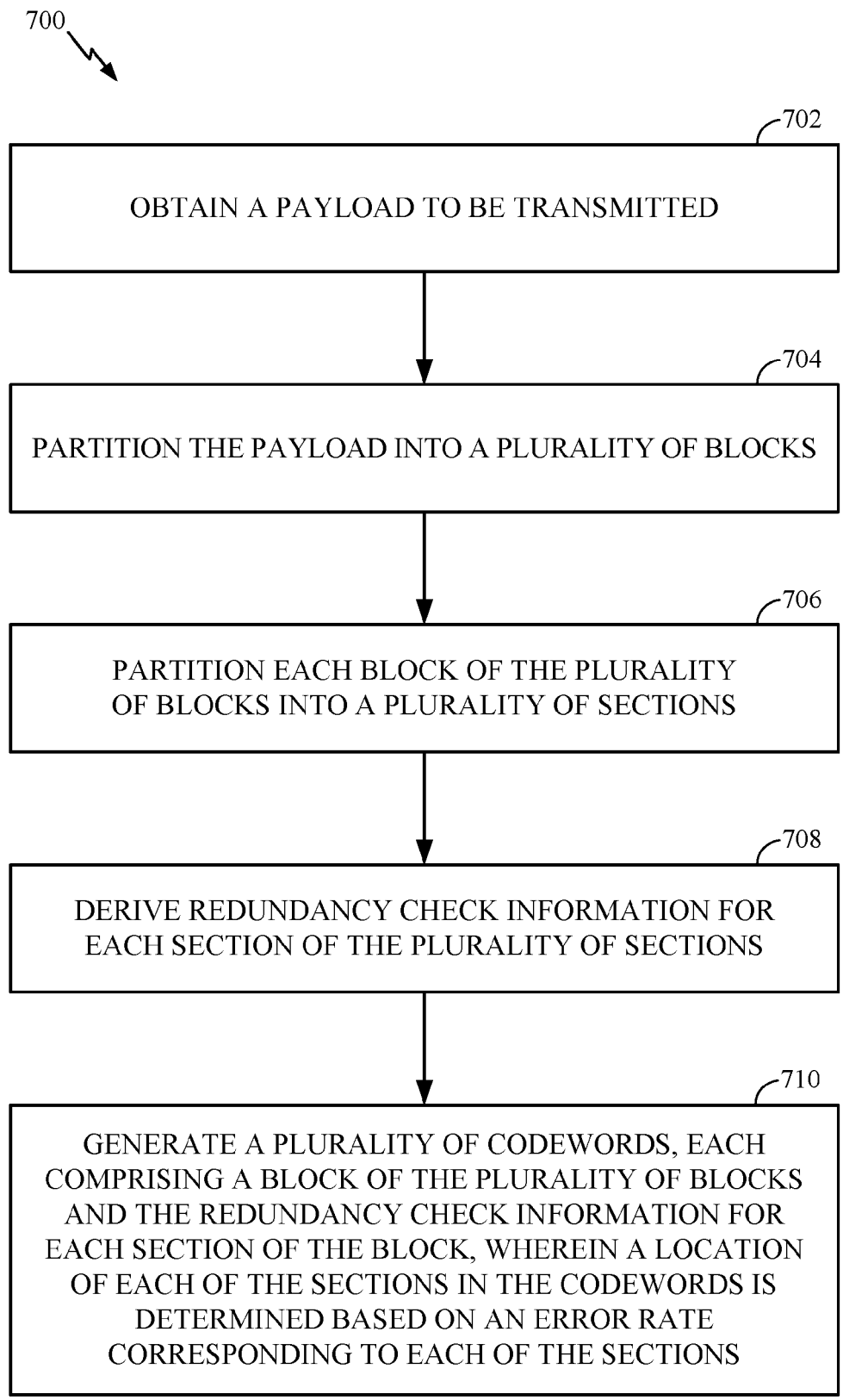
FIG. 7 illustrates an example of operations for wireless communication by a transmitter device, in accordance with certain aspects of the present disclosure.

FIG. 7 illustrates example operations 700 for wireless communications, in accordance with certain aspects of the present disclosure. According to certain aspects, operations 700 may be performed by a wireless transmission device (e.g., wireless device 302).

Operations 700 begin at 702 by obtaining a payload to be transmitted. At 704, the wireless transmission device partitions the payload into a plurality of blocks. At 706, the wireless transmission device partitions each block of the plurality of blocks into a plurality of sections, and at 708, derives redundancy check information for each section of the plurality of sections. At 710, the wireless transmission device generates a plurality of codewords, each comprising a block of the plurality of blocks and the redundancy check information for each section of the block, wherein a location of each of the sections in the codewords is determined based on an error rate corresponding to each of the sections.

Figure 8:
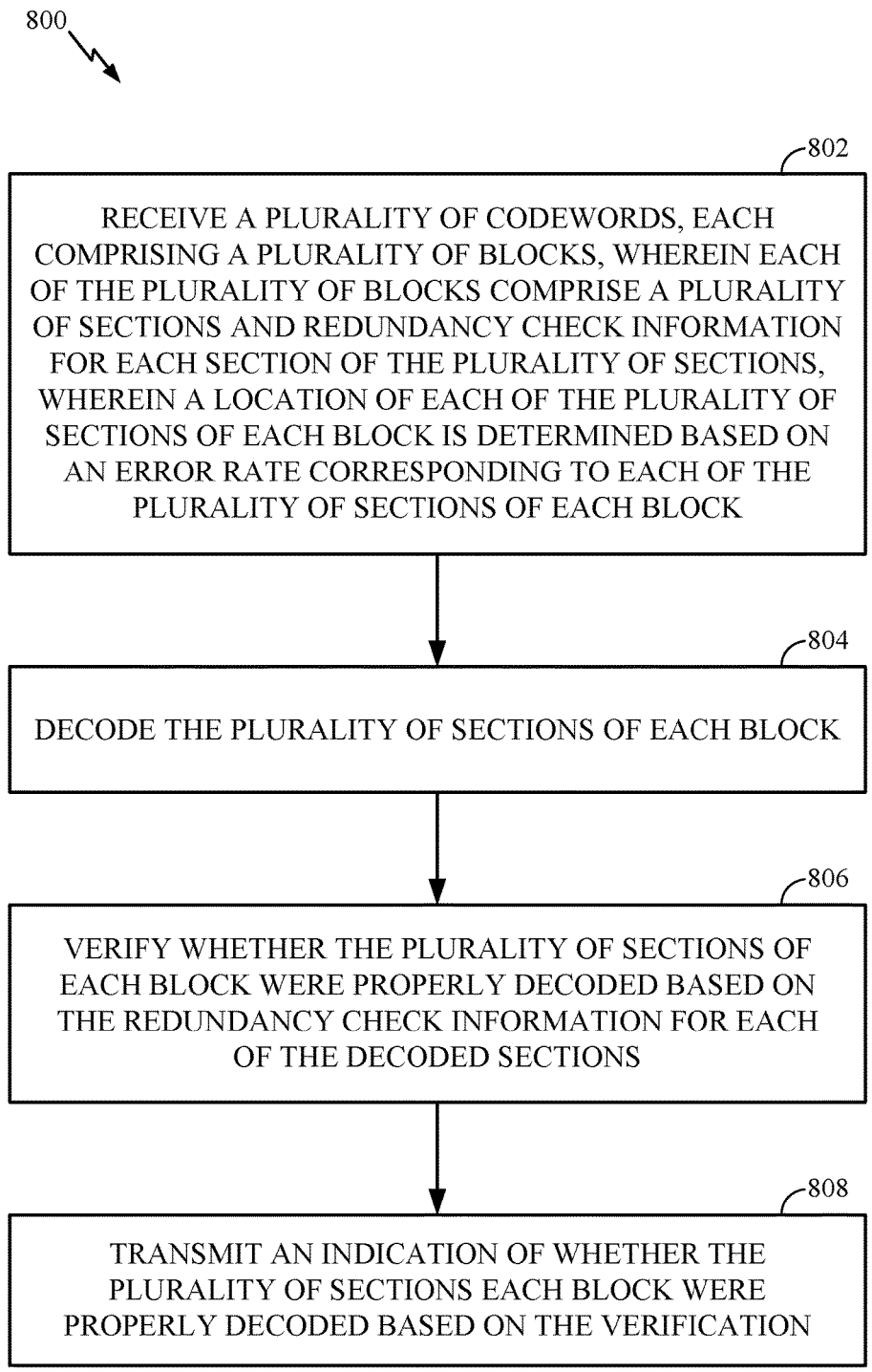
FIG. 8 illustrates an example of operations for wireless communication by a receiver device, in accordance with certain aspects of the present disclosure.

FIG. 8 illustrates example operations 800 for wireless communications, in accordance with certain aspects of the present disclosure. According to certain aspects, operations 800 may be performed by a wireless reception device (e.g., wireless device 302). According to certain aspects, operations 800 may be complimentary to the operations 700. For example, operations 700 may be performed by wireless transmission device for generating (and transmitting) a codeword and operations 800 may be performed by a wireless reception device for receiving and decoding the codeword.

Operations 800 begin at 802 by receiving a plurality of codewords, each comprising a plurality of blocks, wherein each of the plurality of blocks comprise a plurality of sections and redundancy check information for each section of the plurality of sections, wherein a location of each of the plurality of sections of each block is determined based on an error rate corresponding to each of the plurality of sections of each block. At 804, the wireless reception device decodes the plurality of sections of each block. At 806, the wireless reception device verifies whether the plurality of sections of each block were properly decoded based on the redundancy check information for each of the decoded sections. At 808, an indication of whether the plurality of sections of each block was properly decoded is transmitted based on the verification.

FIG. 9A illustrates an example structure 900 of the coded blocks segmented into two groups, in accordance with certain aspects of the present disclosure. As presented above, if a TB size is larger than a threshold (for example, 8000 bits), the TB may be segmented into several blocks and each block may be encoded as one codeword. A CRC may be attached for each block, as illustrated. There are several purposes for the CRC. For example, the CRC can be used to determine if the corresponding block is decoded correctly. Moreover, the CRC may be used for CRC-aided successive cancellation list (CA-SCL) decoding to provide better performance.

In each codeword, all the bit-channels may be sorted from best channel to worst channel according to a respective bit-error probability of the channels. In some aspects, the bit-error probability may be obtained by density evolution or Gaussian approximation. For example, the information bits and CRC may be divided into two groups A and B. Group A may have a lower block error rate as compared to group B. Each codeword may include the CRC bits for group A, data for group A, the CRC bits for group B, and the data for group B. Frozen bits may be allocated to one or more channels having the lowest bit-error probability (worst channels). Therefore, the block error rate of group A may be lower than the error rate of group B. Each coded block may be obtained by bit-reversal permutation and encoding.

FIG. 9B illustrates an example structure 902 of HARQ feedback bits (e.g., for polar codes) for coded blocks segmented into two block groups, in accordance with certain aspects of the present disclosure. As illustrated, two feedback bits may be used to indicate four possible cases. The result of group A or group B may be indicated separately. Thus, it is possible for a transmitter to choose an efficient way to realize HARQ. For example, if the transmitter receives feedback bits as "10", this implies that the codewords in group A are decoded correctly. In this case, the transmitter may prepare the retransmission based on group B without considering group A. For HARQ with chase combining, only the codewords in group B may be retransmitted. In this case, only half of the resources may be used as compared to the existing design of feedback bits. For HARQ with increment redundancy, this also allows for a more efficient way for retransmission in the case where group A is decoded correctly.

Figures 10A, 10B:
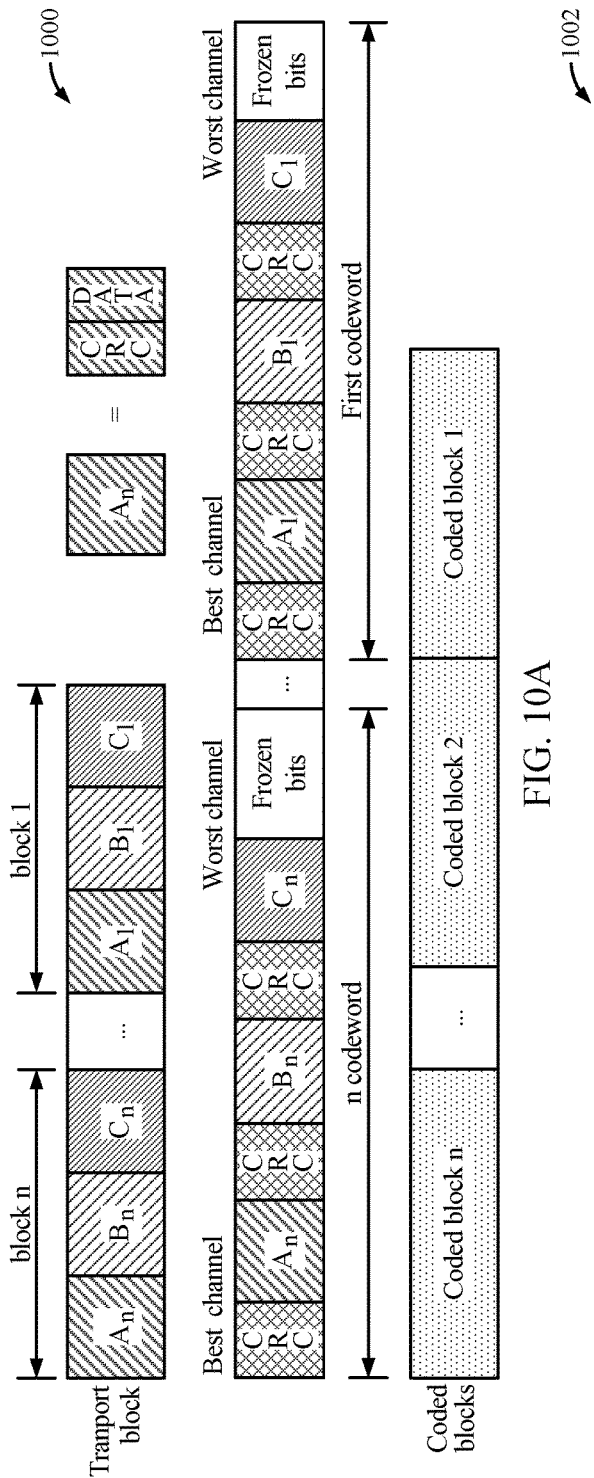
FIG. 10A illustrates an example structure of the coded blocks segmented into three block groups, in accordance with certain aspects of the present disclosure.
FIG. 10B illustrates an example structure of HARQ feedback bits for coded blocks segmented into three block groups, in accordance with certain aspects of the present disclosure.

FIG. 10A illustrates an example structure 1000 of the coded blocks segmented into three groups, in accordance with certain aspects of the present disclosure. There is a CRC attached for all the bits in the TB. The CRC is used to determine if the TB is decoded correctly. The HARQ feedback bits are generated based on the decoding results of the TB. If the TB size is larger than a threshold (e.g., 8000 bits), the TB may be segmented into several blocks and each block may be encoded as one codeword, as illustrated. A CRC is attached for each block.

As presented above, there may be two purposes for the CRC. First, the CRC can be used to determine if the corresponding block is decoded correctly. Second, the CRC may be used for CRC-aided successive cancellation list (CA-SCL) decoding to provide better performance. In each codeword, all the bit-channels may be sorted from best channel to worst channel according to the bit-error probability. The bit-error probability may be obtained by density evolution or Gaussian approximation.

In this case, the information bits and CRC attached are divided into three groups: group A with lowest block error rate, group B with low block error rate (e.g., higher than group B but lower than group C) and group C with highest block error rate. Each codeword may include CRC bits for group A, data for group A, CRC bits for group B, data for group B, CRC bits for group C, data for group C. Moreover, frozen bits may be allocated to one or more channels having the lowest bit-error probability (worst channels). Therefore, the block error rate of group A may be lower than that of group B and the block error rate of group B may be lower than that of group C. Each coded block is obtained by bit-reversal permutation and encoding.

FIG. 10B illustrates an example structure 1002 of HARQ feedback bits (e.g., for polar codes) for coded blocks segmented into three block groups, in accordance with certain aspects of the present disclosure. For three groups, three bits may be used for HARQ feedback, each bit corresponding to one of the three groups. However, aspects of the present disclosure may use two feedback bits instead of three. That is, the number of feedback bits can be reduced by considering the relationship among the block error rates of group A, group B, and group C. Since block error rate of group A is lower than that of group B and block error rate of group B is lower than that of group C, the probability that group A is not decoded correctly while group B or group C is decoded correctly is low. Similarly, the probability that group B is not decoded correctly while group C is decoded correctly is low.

Therefore, aspects of the present disclosure provide an efficient design of HARQ feedback using two bits for three groups by eliminating the cases with low probability. For example, if the transmitter receives feedback bits "10", this implies that the codewords in group A and group B are decoded correctly. The transmitter will prepare the retransmission based on group C without considering group A and group B. For HARQ with chase combining, only the codewords in group C may be retransmitted. In this case, only one third of the resources may be used as compared to the existing design of feedback bits. For HARQ with increment redundancy, it is also easy to find an efficient way for retransmission on condition that the group A and group B are decoded correctly.

While examples provided herein have described HARQ feedback with codewords segmented into two groups and three groups to facilitate understanding, the techniques provided herein may be applied to codewords segmented into any number of groups. For example, in a case where the coded blocks are segmented into four block groups (groups A-D), the number of feedback bits can be reduced by considering the relationship among the block error rates of group A-D, similar to the aspects described with three groups.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application specific integrated circuit (ASIC), or processor.

For example, means for processing, means for generating, means for obtaining, means for partitioning, means for determining, means for deriving, means for merging, means for verifying, means for concatenating, means for interleaving, means for decoding, and means for encoding may comprise a processing system, which may include one or more processors, such as the TX data processor 214, the processor 230, and/or the RX data processor 242 of the access point 210 illustrated in FIG. 2 or the TX data processor 238, the processor 270, and/or the RX data processor 260 of the user equipment 250 illustrated in FIG. 2. Additionally, means for transmitting and means for receiving may comprise a TMTR/RCVR 224 of the access point 210 or a TMTR/RCVR 252 of the user equipment 250.

According to certain aspects, such means may be implemented by processing systems configured to perform the corresponding functions by implementing various algorithms (e.g., in hardware or by executing software instructions) described above.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and/or write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and BLU-RAY® media disc where disks usually reproduce data magnetically, while discs reproduce data optically with lasers. Combinations of the above should also be included within the scope of computer-readable media.

As used herein, a phrase referring to "at least one of" a list of items refers to any combination of those items, including single members. As an example, "at least one of: a, b, or c" is intended to cover: a, b, c, a-b, a-c, b-c, and a-b-c.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method for wireless communications, comprising:
   obtaining a payload to be transmitted;
   partitioning the payload into a plurality of blocks;
   partitioning each block of the plurality of blocks into a plurality of sections;
   deriving redundancy check information for each section of the plurality of sections;
   generating a plurality of codewords, each comprising a block of the plurality of blocks and the redundancy check information for each section of the block, wherein the sections in a respective codeword of the plurality of codewords are arranged in the codeword based on an error rate corresponding to each of the sections;
   transmitting the plurality of codewords to a wireless node; and
   receiving feedback from the wireless node indicating whether the plurality of sections of each block were decoded by the wireless node, wherein the feedback comprises one or more bits.

2. The method of claim 1, wherein the plurality of sections of each block comprises a first section, a second section, and a third section, and wherein the first section of each block has a lower error rate than the second section of each block and the second section of each block has a lower error rate than the third section of each block.

3. The method of claim 2, wherein:
   receiving the feedback comprises receiving an indication that the first section of each block or the second section of each block was not decoded;

the method further comprises:
  determining whether the third section of each block was decoded based on the indication; and
  retransmitting the third section of each block based on the determination.

4. The method of claim 1, wherein the plurality of sections of each block comprises at least three sections, and wherein the indication comprises a fewer number of bits than a number of sections of each block.

5. The method of claim 1, wherein:
  receiving the feedback comprises receiving an indication that two sections of each block were not decoded, wherein the indication comprises a bit corresponding to each of the two sections; and
  the method further comprises re-transmitting the two sections of each block based on the indication.

6. The method of claim 1, wherein the redundancy check information comprises a cyclic redundancy check (CRC).

7. The method of claim 1, wherein the codewords are encoded using polar coding.

8. A method for wireless communications, comprising:
  receiving a plurality of codewords, each comprising a plurality of blocks, wherein each of the plurality of blocks comprises a plurality of sections and redundancy check information for each section of the plurality of sections, wherein the plurality of sections in a respective codeword of the plurality of codewords are arranged in the codeword based on an error rate corresponding to each of the plurality of sections of each block;
  decoding the plurality of sections of each block;
  verifying whether the plurality of sections of each block were decoded based on the redundancy check information for each of the decoded sections; and
  transmitting feedback comprising an indication of whether the plurality of sections of each block was decoded based on the verification, wherein the feedback comprises one or more bits.

9. The method of claim 8, wherein the plurality of sections of each block comprises at least three sections, and wherein the indication comprises a fewer number of bits than a number of sections of the plurality of sections.

10. The method of claim 8, wherein the plurality of sections of each block comprises a first section, a second section, and a third section, and wherein the first section of each block has a lower error rate than the second section of each block and the second section of each block has a lower error rate than the third section of each block.

11. The method of claim 10, wherein the indication comprises a first bit used to indicate whether the second section of each block was decoded and a second bit used to indicate whether the third section of each block was decoded.

12. The method of claim 8, further comprising:
  transmitting an indication of whether two sections of each block were decoded based on the verification, wherein the indication comprises a bit corresponding to each of the two sections.

13. The method of claim 8, wherein the redundancy check information comprises a cyclic redundancy check (CRC).

14. The method of claim 8, wherein the decoding comprises performing CRC-aided successive cancellation list (CA-SCL) decoding based on the redundancy check information.

15. The method of claim 8, wherein the codewords are encoded using polar coding.

16. An apparatus for wireless communications, comprising:
  means for obtaining a payload to be transmitted;
  means for partitioning the payload into a plurality of blocks;
  means for partitioning each block of the plurality of blocks into a plurality of sections;
  means for deriving redundancy check information for each section of the plurality of sections;
  means for generating a plurality of codewords, each comprising a block of the plurality of blocks and the redundancy check information for each section of the block, wherein the sections in a respective codeword of the plurality of codewords are arranged in the codeword based on an error rate corresponding to each of the sections;
  means for transmitting the plurality of codewords to a wireless node; and
  means for receiving feedback from the wireless node indicating whether the plurality of sections of each block were decoded by the wireless node, wherein the feedback comprises one or more bits.

17. The apparatus of claim 16, wherein the plurality of sections of each block comprises a first section, a second section, and a third section, and wherein the first section of each block has a lower error rate than the second section of each block and the second section of each block has a lower error rate than the third section of each block.

18. The apparatus of claim 17, wherein:
  the means for receiving feedback comprises means for receiving an indication that the first section of each block or the second section of each block was not decoded;
  the apparatus further comprising:
    means for determining whether the third section of each block was decoded based on the indication; and
    means for retransmitting the third section of each block based on the determination.

19. The apparatus of claim 16, wherein the plurality of sections of each block comprise at least three sections, and where the indication comprises a fewer number of bits than a number of sections of each block.

20. The apparatus of claim 16, wherein:
  the means for receiving the feedback comprises means for receiving an indication that two sections of each block were not decoded, wherein the indication comprises a bit corresponding to each of the two sections; and
  the apparatus further comprises means for re-transmitting the two sections of each block based on the indication.

21. The apparatus of claim 16, wherein the redundancy check information comprises a cyclic redundancy check (CRC).

22. The apparatus of claim 16, wherein the codewords are encoded using polar coding.

23. An apparatus for wireless communications, comprising:
  means for receiving a plurality of codewords, each comprising a plurality of blocks, wherein each of the plurality of blocks comprises a plurality of sections and redundancy check information for each section of the plurality of sections, wherein the plurality of sections in a respective codeword of the plurality of codewords are arranged in the codeword based on an error rate corresponding to each of the plurality of sections of each block;
  means for decoding the plurality of sections of each block;

means for verifying whether the plurality of sections of each block were decoded based on the redundancy check information for each of the decoded sections; and means for transmitting feedback comprising an indication of whether the plurality of sections of each block was decoded based on the verification, wherein the feedback comprises one or more bits.

24. The apparatus of claim 23, wherein the plurality of sections of each block comprises at least three sections, and wherein the indication comprises a fewer number of bits than a number of sections of the plurality of sections.

25. The apparatus of claim 23, wherein the plurality of sections of each block comprises a first section, a second section, and a third section, and wherein the first section of each block has a lower error rate than the second section of each block and the second section of each block has a lower error rate than the third section of each block.

26. The apparatus of claim 25, wherein the indication comprises a first bit used to indicate whether the second section of each block was decoded and a second bit used to indicate whether the third section of each block was decoded.

27. The apparatus of claim 23, further comprising:

means for transmitting an indication of whether two sections of each block were decoded based on the verification, wherein the indication comprises a bit corresponding to each of the two sections.

28. The apparatus of claim 23, wherein the redundancy check information comprises a cyclic redundancy check (CRC).

29. The apparatus of claim 23, wherein the means for decoding comprises means for performing CRC-aided successive cancellation list (CA-SCL) decoding based on the redundancy check information.

30. The apparatus of claim 23, wherein the codewords are encoded using polar coding.

* * * * *